United States Patent [19]
Karnezos

[11] Patent Number: 4,813,129
[45] Date of Patent: Mar. 21, 1989

[54] INTERCONNECT STRUCTURE FOR PC BOARDS AND INTEGRATED CIRCUITS

[75] Inventor: Marcos Karnezos, Palo Alto, Calif.

[73] Assignee: Hewlett-Packard Company, Palo Alto, Calif.

[21] Appl. No.: 64,411

[22] Filed: Jun. 19, 1987

[51] Int. Cl.⁴ .............................................. H01R 9/09
[52] U.S. Cl. ..................................... 29/832; 361/406; 439/74
[58] Field of Search ........................ 439/55, 65, 81, 82, 439/85, 78, 74; 361/402–408, 411, 414; 29/832, 840, 846–851

[56] References Cited

U.S. PATENT DOCUMENTS

| | | | |
|---|---|---|---|
| 3,880,486 | 4/1975 | Avakian | 361/406 |
| 3,986,255 | 10/1976 | Mandal | 29/840 |
| 4,125,310 | 11/1978 | Reardon, II et al. | 339/92 M |
| 4,403,272 | 9/1983 | Larson et al. | 439/85 |
| 4,548,451 | 10/1985 | Benarr et al. | 29/848 |
| 4,581,679 | 4/1986 | Smolley | 361/393 |

OTHER PUBLICATIONS

IBM Bulletin, Essert, vol. 7, No. 10, p. 873, 3-1965.
IBM Bulletin, Ward, vol. 18, No. 9, p. 2817, 2-1976.
"Button Board—A New Technology Interconnect for 2 and 3 Dimensional Packaging"by R. Smolley, for presentation to ISHM, Anaheim, CA, Nov. 11-14, 1985.
"TRW's Superchip Passes First Milestone", *Electronics*, Jul. 10, 1986.

*Primary Examiner*—Neil Abrams
*Attorney, Agent, or Firm*—Paul L. Hickman

[57] ABSTRACT

An interconnect structure for electrically coupling conductive paths on two adjacent, rigid substrates, such as PC boards or IC chips. The interconnect structure includes a number of buttons formed on a first substrate, and a number of contacts formed on a second substrate. The buttons are elastically deformable, and include a resilient core made from an organic material such as polyimide, and a metallic coating formed over the core. The two substrates are compressed between mounting plates such that the buttons are pressed against the contracts to make electrical contact.

3 Claims, 4 Drawing Sheets

INTERCONNECT STRUCTURE FOR PC BOARDS AND INTEGRATED CIRCUITS

TECHNICAL FIELD

This invention relates generally to printed circuit (PC) boards and integrated circuits (ICs), and more particularly to structures for electrically coupling electronic substrates together.

BACKGROUND ART

Printed circuit (PC) boards are used to electrically interconnect the many electronic components of an electronic circuit. A typical PC board includes an insulating substrate, usually made from a resinous plastic, and a number of conductive metal paths or "traces" for carrying power and signals between the various components of the circuit.

Many electronic systems divide their circuitry among a number of individual PC boards, and thus require an effective means for coupling the boards together. The most commonly used type of interconnect for this purpose is an "edge connector" which engages an edge of a PC board to contact pads formed thereon.

While edge connector technology is adequate when the number of required interconnects is small, problems arise as the interconnect requirements increase. For example, with edge connectors all connection must be made at the edges of the PC board, which requires the PC board designer to route the desired signals through the maze of components to the periphery of the PC board. This requirement may result in a less-than-optimal layout of the components and increase the size of the PC board, thereby possibly reducing the performance of the electronic circuit. Furthermore, since the contact pads of the PC board must be made sufficiently large to ensure adequatecontact with the edge connectors and must be sufficiently spaced to prevent shorts, the contact density of the edge connector technology is quite low, i.e. approximately eight contacts/cm. Also, since the contact pads are linearly arranged along board edges, the length of the edge connector in direct proportion with the number of signals to be routed off-board. This, in itself, can cause reliability problems, because PC boards tend to warp, which may cause poor contact between some of the contact pads and the edge connector as the length of the edge connector increases.

Due to the aforementioned limitations of edge connectors, a number of interconnect structures have been devised for more efficiently interconnecting PC boards. For example, in U.S Pat. No. 4,125,310, of Reardon, et al., an interconnect structure is disclosed which interconnects wire cables from PC boards or electrical components with a pair of chemically milled, thin metallic wafers. One of the wafers is plated with metallic buttons, while the other wafer is plated with contact pads. The two wafers are placed together and then compressed to force the metallic buttons into firm contact the contact pads of the adjoining wafer. This "metal button" technology permits two dimensional interconnections of approximately sixteen-hundred contacts/cm$^2$.

Another interconnect structure is disclosed in U.S. Pat. No. 4,581,679 of Smollev which teaches an insulated board provided with a plurality of openings, and a number of connector elements comprising compressible wads of conductive wire which are lodged within selected openings of the insulated board. The insulated board is sandwiched between a pair of PC boards, thereby pressing the connector elements into contact with PC board contact pads to electrically couple the PC boards together. The structure described in the Smollev patent will permit two dimensional interconnections at a density of approximately twenty-five lines/cm$^2$.

Electronic and electrical components can be attached to a PC board in a variety of ways, the most common of which is the provision of a number of predrilled contact pads which are receptive to leads of the components. Once the leads are engaged with the PC board holes, they are soldered to the pads to form a semi-permanent electrical connection with the PC board.

A higher density method for interconnecting an electronic component to a PC board involves the use of "surface mount technology" where the leads from the electronic components are soldered directly to the surface of pads on the PC board without being inserted into drill-holes. Surface mount technology permits an interconnection density which is approximately a factor of two greater than that of conventional, through-the-board mounting technology, allowing the manufacture of smaller, higher performance PC boards.

Other IC to PC board connection technologies include tape automated bonding (TAB) technology, and "solder bump" technology. With tape automated bonding, a tape provided with conductive traces is ultrasonically bonded to contact pads on the IC and the PC board, resulting in an interconnect density of approximately 20 contacts/cm.

With solder bump technology, an IC is turned over or "flipped" and solder bumps are provided on its active surface for direct bonding to contacts on a PC board or on another IC. While the solder bump technology is currently the most dense, commercially available interconnect technology with a two dimensional interconnect capacity of approximately twenty-five hundred contacts/cm$^2$, it suffers from the disadvantage that, due to thermal expansion problems, the ICs with which it is used must be quite small. Also, the non-compliant nature of the solder bumps has the result of supporting the various IC's at different heights. Because the IC's usually must be liquid cooled to enhance their heat dissipation, the non-planarity of the IC's requires elaborate and expensive cooling systems. Furthermore, solder bump mounted IC's are difficult to assemble and repair. For these and other reasons, solder bump technology remains very expensive, and only desirable for the most demanding of applications.

What the related art does not disclose, then, is an interconnect structure for electrically interconnecting PC boards, ICs, and ICs to PC boards, which has a high contact density and compliance, which can be assembled and disassembled easily, and which is an economically feasible alternative to conventional interconnect structures.

SUMMARY OF THE INVENTION

An object of this invention is to provide a very-high-density interconnect structure between two hard substrates, such as PC boards and ICs.

Another object of this invention is to provide an interconnect structure which is economical and well-adapted to mass production techniques.

Yet another object of this invention is to provide an interconnect structure which can be easily assembled and disassembled, both in the plant and in the field.

Briefly, the invention includes a substrate, conductive traces formed on a surface of the substrate, and a number of protuberances or "buttons" rising above the surface of the substrate and coupled to selected traces. Each button includes a resilient, plastic core, and a metallization layer which extends over the core and contacts one or more of the traces.

A method for making the interconnect structure includes the steps of applying a layer of polyimide to the substrate, removing portions of the polyimide layer by means of a photolithographic technique to form polyimide bumps, and applying a metal coating to the bumps to form the metallized buttons. Typically, the metal coating includes several layers of different metals, such as copper, chromium, and gold.

An advantage of this invention is that a high-density interconnections can be made between two hard substrates.

Another advantage of this invention is that the interconnect structure can be easily assembled and disassembled. This means that the circuitry associated with the interconnect structure can be repaired in the field.

A further advantage of this invention is that the interconnect structure does not require the high temperature processing for assembly and repair, as does the aforementioned solder bump technology.

Yet another advantage of this invention is that large ICs can be mounted without damage due to thermal expansion mismatch with the underlying PC board because the polyimide buttons can flex to permit different expansion rates between the IC's and the PC board.

A still further another advantage of this invention is that electrical path length and, therefore, propagation delays are reduced due to the high interconnection density permitted by the structure of this invention. Furthermore, by using low dielectric constant materials, such as the aforementioned polyimide, the interconnection capacitances are further reduced, enabling very high speed circuit operation.

Another advantage of this invention is that it permits the design of PC boards and ICs to be simplified. Because the interconnect leads on the PC board or IC do not have to be routed to an edge, but rather can be provided near the active components of the chips, fewer layers are required in the manufacture of a particular PC board or IC, thus reducing their manufacturing complexity.

A still further advantage of this invention is that by controlling the shape of the buttons, a wiping action can be provided during the assembly process, which provides a fresh, metal surface on the buttons and the button contacts for better electrical connections.

A further advantage of the present invention is that the interconnect structure of the present invention can be extended in three dimensions stacking several substrates having buttons and contacts formed on their facing surfaces. This configuration is extremely advantageous when space is at a premium (such as in a space satellite) or when electrical path lengths must be kept very short for high-speed operation (such as in high-performance computers).

These and other objects of the present invention will no doubt become apparent to those skilled in the art upon a reading of the following descriptions and a study of the various figures of the drawing.

DETAILED DESCRIPTION OF THE PREFERRED EMBODIMENTS

Figure 1:
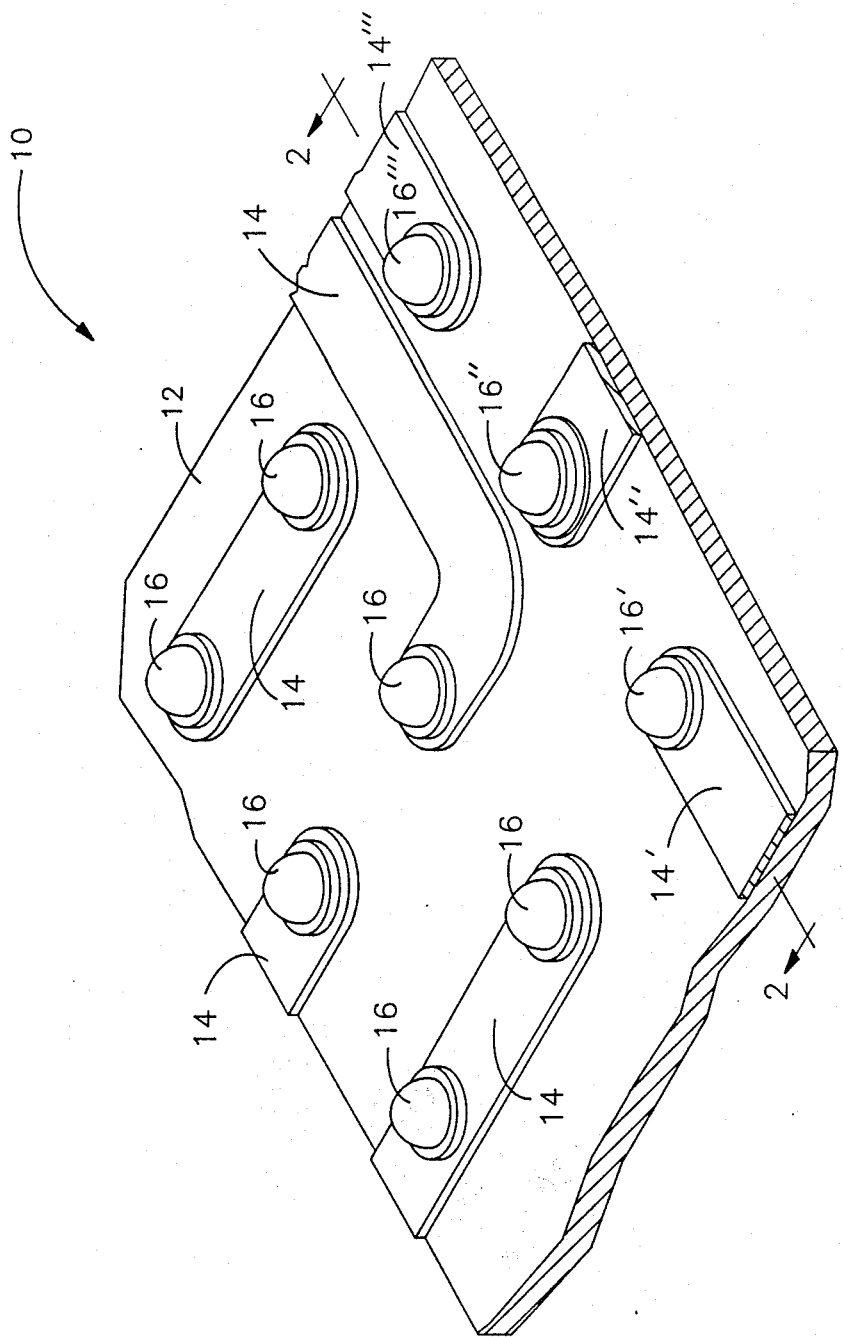
FIG. 1 is a perspective view of an interconnect structure in accordance with the present invention.

Referring to FIG. 1, an interconnect structure 10 in accordance with the present invention includes a substrate 12, a number of conductive paths or traces 14, and a number of protuberances or buttons 16. The buttons 16 are often arranged in a two dimensional matrix, as shown.

The substrate 12 is typically a planar member made from insulating material. Common substrates include PC boards, multi-layer ceramics, and copper-polyimide thin-film multi-layers. In the case of integrated circuits the substrate is typically made from silicon or gallium arsenide. In any event, the substrate 12 should be dimensionally stable and as planar as possible to facilitate good interconnection contacts.

The traces 14 are typically made from a thin film of metal (such as copper or gold) although in some cases, other conductive materials such as silicide are used. In the case of PC boards, the traces 14 are almost always copper or gold-plated copper, while in the case of ICs, the traces 14 may be copper, gold, aluminum, or silicide.

Figure 2:
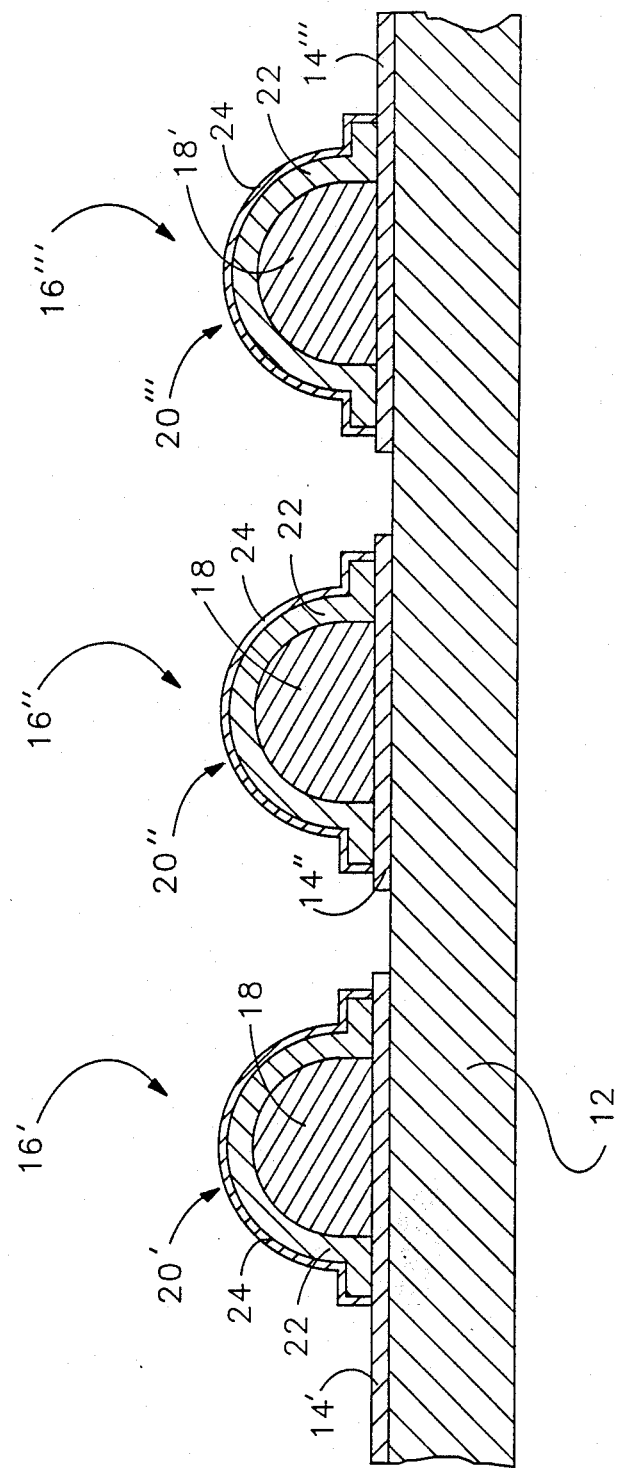
FIG. 2 is a cross-sectional view taken along line 2—2 of FIG. 1.

With additional reference to FIG. 2, three buttons 16', 16", and 16''' are shown in cross-section. Each button includes a resilient core 18 made from an organic material such as polyimide, and is covered with a metallic coating 20 which often comprises one or more layers such as layers 22 and 24. The metallic coating 20 is coupled to the associated trace 14. In other words, the metallic coating 20 of buttons 16', 16", and 16''' are electrically coupled to their respective traces 14', 14", and 14'''.

Figure 3:
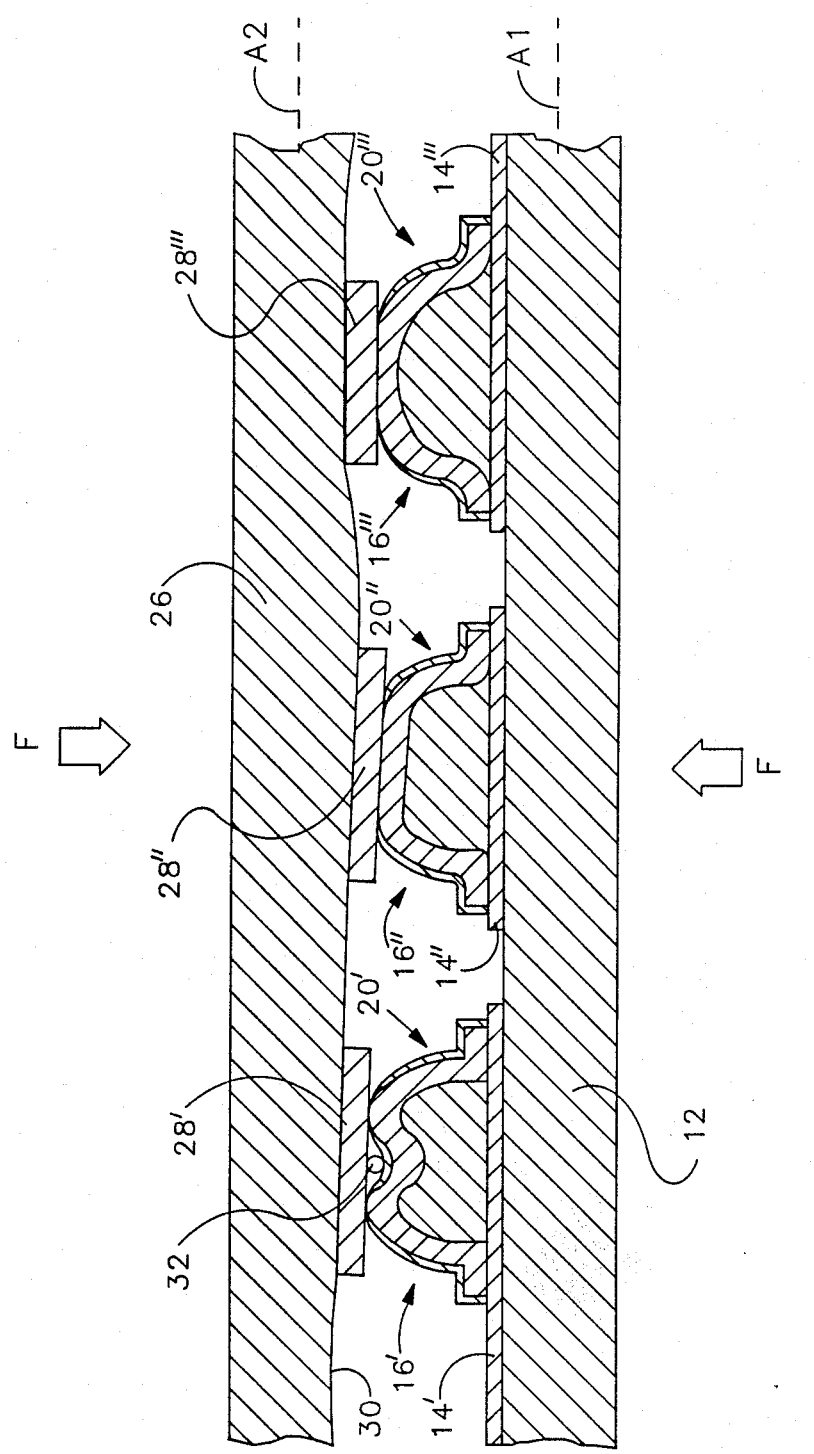
FIG. 3 is a cross-sectional view illustrating the coupling of two substrates using the interconnect structure of the present invention.

Referring now to FIG. 3, a second substrate 26 is shown which includes a number of contact pads 28', 28", and 28''' which are adapted to contact the buttons 16', 16", and 16''', respectively, of the first substrate 12. The contact pads 28 are coupled to traces (not shown) on the second substrate 26 which, in turn, are coupled to various electronic and electrical components (also not shown).

The inner surface 30 of substrate 26 is shown with an exaggerated warp in order to illustrate the operation of the interconnect structure of this invention. Furthermore, the axes A1 of substrate 12 and A2 of substrate 26 are shown as being non-parallel for the same reason.

When the substrates 12 and 26 are pressed together by a net force F of approximately 2000 PSI, the buttons 16', 16", and 16''' are urged against their respective contact pads 28', 28", and 28'''. The force F is sufficient to deform the buttons 16 to ensure good electrical contact between the buttons 16 and the traces 28. However, due to such factors as warpage or local non-planarity in one or more of the substrates, or due to non-parallel alignment between the axes of the substrates, some of the buttons 16 will be deformed to a greater degree than the other buttons.

For example, in FIG. 3 the button 16" is shown with the greatest degree of deformation, while the button 16'" shows the least degree of deformation. Furthermore, the pliancy of the buttons 16 allow adequate electrical contacts even when particulate matter, such as a dust particle 32, becomes lodged between a button 16 and a contact 28. In any case, the buttons 16 which make first contact will deform elastically up to a point and then undergo plastic deformation, thereby maintaining a constant force until the remainder of the buttons 16 establish contact with their respective contacts 28. The plastic deformation of the first contacted buttons 16 is permanent and tends to planarize the buttons 16, such that subsequent assembly of the substrates will require less force.

It has been found that conventional lithographic techniques can produce buttons 16 which have a center-to-center pitch of approximately 40 micrometers. Therefore, a linear contact density of 250 contact/cm and an area density of 62,500 contact/cm$^2$ can be achieved using conventional photolithography techniques. Even greater contact densities can be achieved if lower yields are accepted, and by using more sophisticated lithography techniques.

Figure 4A:
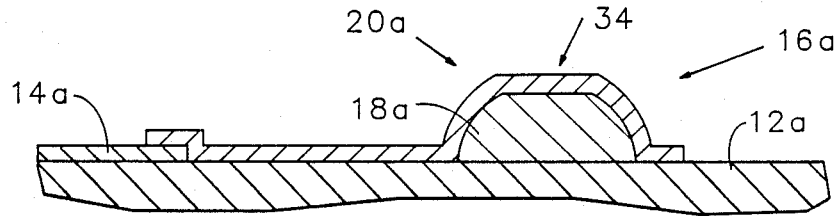
FIGS. 4A–4D illustrate several alternative configurations for the buttons of the present invention.

Referring now to FIG. 4a, an alternate embodiment for a button 16a includes a core 18a and a metallic coating 20a. The button 16a is supported by a substrate 12a and is in electrical contact with a trace 14a via the metallic coating 20a. The button 16a is substantially hemispherical in shape, but includes a flattened top portion 34 which provides increased surface area for contact with a contact pad of an adjacent substrate (not shown).

Figure 4B:
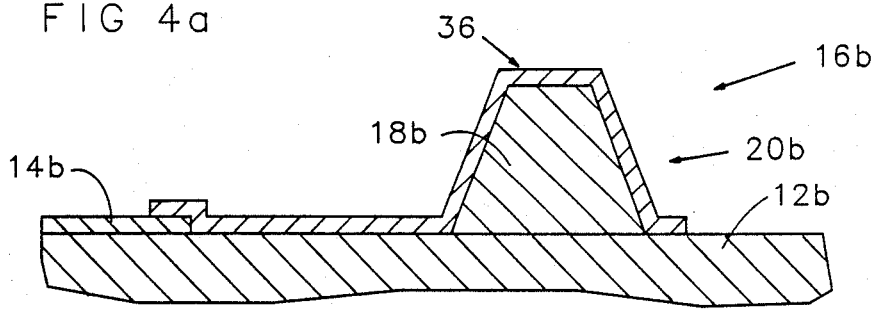

With reference to FIG. 4b, a button 16b is illustrated which is either a truncated cone or a truncated pyramid in configuration. The button 16b includes a polyimide core 18b, and a metallic coating 20b which contacts a trace 14b. Both the trace 14b and the button 16b are supported by a substrate 12b. Again, the button 16b can include a flattened top portion 36 to provide a greater surface area for contact with a contact pad of an adjacent substrate.

Figure 4C:
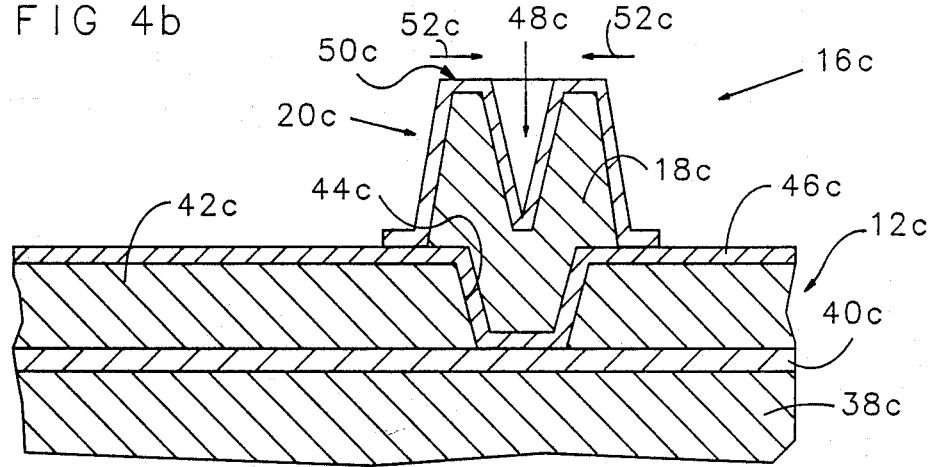

In FIG. 4c, a button 16c is coupled to a multi-layer substrate 12c including a first insulating layer 38c, a conductive layer 40c, and a second insulating layer 42c. A via 44c is formed in second insulating layer 42c to the conductive layer 40c, and a conductive trace 46c is deposited over the surface of insulating layer 42c and within via 44c.

The button 16c includes a polyimide core 18c and a metallic coating 20c. When the polyimide core 18c is formed over the substrate 12c, a crater 48c is formed in the core 18c due to the via 44c beneath it. This crater 48c is maintained after the metallic coating 20c is applied to the core 18c and over a portion of the conductive trace 46c.

Due to the crater 48c, the flattened top portion 50c of button 16c will perform a wiping action on the contact pad of the adjoining substrate, as illustrated by arrows 52c. As portions of the top portion 50c wipe across the contact pads of the adjacent substrate, oxides are scraped away from both the buttons and the contacts to expose fresh, clean metal, ensuring a good contact.

Figure 4D:
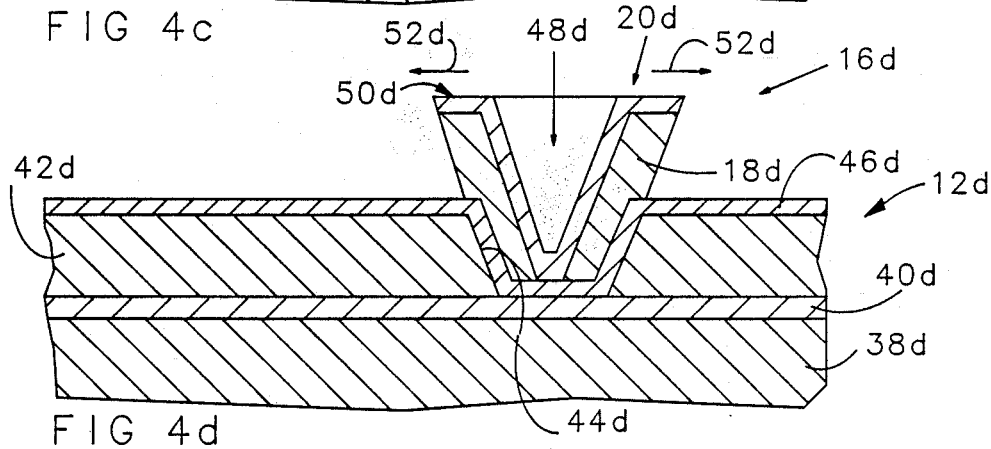

Referring now to FIG. 4d, a button 16d is formed over a multi-layer substrate 12d, including a first insulating layer 38d, a conductive layer 40d, and a second insulating layer 42d. A via 44d is provided in the second insulating layer 42d to the conductive layer 40d. As before, a conductive trace 46d is applied over the insulating layer 42d and within the via 44d. The button 16d includes a core 18d and a metallic coating 20d, and has a shape of an inverted, truncated pyramid or cone. Again, due to the via 44d, a crater 48d is formed in the middle of button 16d, which permits wiping action as indicated at 52d as the flattened top portion 50d of button 16d is pressed against a contact pad of an adjacent substrate to ensure good electrical contact.

A method for producing the buttons 16 as illustrated in FIGS. 1-4 generally utilizes photolithography techniques. As should be apparent from the above descriptions, the starting material is the substrate having the electrical paths or traces terminating at contact pads.

As a first step, a thick film of polyimide is spun onto or laminated onto the substrate to a thickness approximately equal to the desired button height, for example 25 micrometers. A thin aluminum film is then deposited over the polyimide, and a layer of photoresist is spun over the aluminum film and soft baked. The resist is then exposed to an energy source, such as ultraviolet light, through a photolithographic mask defining the button pattern. After exposure, the resist is developed and then hard baked.

After the resist is developed and hardened by the hard bake process, the thin aluminum film is etched in an acid solution. Next, the polyimide layer is etched in a $CF_4$ and $O_2$ plasma chamber using the aluminum as an etch mask. After the polyimide is patterned to form the buttons, the remaining resist and aluminum layers are stripped from the substrate.

At this point in the process, the polyimide core of the buttons have been formed on or near the appropriate contact pads of the substrate. To complete the formation of the buttons, the metallic coating is applied to the button's surface by, for example, evaporation or sputtering techniques well known to those skilled in the art. Typically, several metal layers will be used to enhance performance and durability. For example, a first layer of chromium (Cr) can be applied, and then a second layer of gold (Au) can be applied over the chromium layer to create a two-layer metallic coating for the button. Other metallic coating configurations include Cr/Cu/Au; Ti/Au; Be/Cu/Au; and Ag/Au. A typical total thickness for the metallic coating 20 is approximately one micrometer.

To pattern the metal, another layer of photoresist is spun over the substrate and the polyimide cores to planarize the substrate, and then the substrate is soft baked. The photoresist is then exposed to an energy source through a photolithographic mask, developed, and hard baked to form a photoresist mask. Finally, the metal layers are wet etched through the photoresist mask.

After the metal layers are etched, the resist is stripped to reveal the contact metallizations on the buttons. The contact pads for an adjoining substrate are made by conventional photolithography techniques, and the interconnect structure is ready for assembly.

An alternate method for metallizing the button cores includes the steps of depositing a thin layer of chromium over the substrate and cores prior to spinning the resist over the substrate. After the resist has been soft baked, exposed, developed, and hard baked, the CR layer is used as a plating base, and the developed resist pattern as a stencil, such that metallization can be plated upwardly to form the contacts.

Different shape of plastic buttons can be achieved by means of appropriate photomasks and by controlling the plasma etching process. For example, by changing the pressure/gas composition inthe plasma chamber, the wall slope of the polyimide cores can be changed from an overcut to an undercut configuration.

It should be noted that other materials besides polyimide can be used for the button cores. For example, polyphenylene sulfide compounds and fluoropolymers have appropriate elastic and processing parameters to be useful in this process. However, since the properties of polyimide under photolithographic conditions are well known, and because polyimide has a low dielectric constant, it is considered well-suited for the process of this invention.

It should also be noted that the metal layer or layers applied to the button cores do not necessarily entirely cover them. In fact, only partial covering of the button cores by the metal layers may be desirable, because the cores could then freely expand under an applied pressure without the danger of fracturing the metal applied to them. This is because the polyimide has a lower Young's Modulus than the metal covering it, and requires additional room for expansion. Furthermore, if the metal is appropriately patterned, it will tend to bend elastically under the applied pressure, rather than be plastically deformed.

While this invention has been described in terms of several preferred embodiments, those skilled in the art will recognize various modifications, additions, and permutations thereof upon a reading of the preceding descriptions and a study of the various figures of the drawing. For example, stops could be provided between the two, hard substrates to prevent over-compression, and possible damage, to the buttons.

It is therefore intended that the following appended claims be interpreted as including all such modifications, additions, and permutations as fall within the true spirit and scope of the present invention.

What is claimed is:

1. A method for making an interconnect structure between a first conductive path on a first substrate and a second conductive path on a second substrate comprising the steps of:

forming a protuberance on a surface of said first substrate which includes a resilient core made from an organic material, and a conductive coating formed on an external surface of said core and coupled to aid fist conductive path, by applying a layer of said organic material to said first substrate and removing portions of said layer of organic material from said substrate to leave said protuberance; and forming contact means on a surface of said second substrate adapted to contact said protuberance, said contact means being electrically coupled to said second conductive path.

2. A method for making an interconnect structure as recited in claim 1 wherein said step or removing portions of said layer of organic material includes the steps of:

applying a resist over said layer of organic material;
   exposing said resist to an energy pattern;
   developing said resist to form a mask;
   etching said layer of organic material through said mask remove said portions of said layer of organic material; and
   removing said mask.

3. A method for making an interconnect structure as recited in claim 2 wherein said step of removing portions of said layer of organic material further includes the step of:

applying a layer of aluminum to said layer of organic material prior to the application of said resist, said layer of aluminum forming part of said mask.

* * * * *